United States Patent
Wang et al.

(10) Patent No.: US 7,263,001 B2
(45) Date of Patent: Aug. 28, 2007

(54) COMPACT NON-VOLATILE MEMORY CELL AND ARRAY SYSTEM

(75) Inventors: Bin Wang, Seattle, WA (US); Christopher J. Diorio, Shoreline, WA (US); Todd E. Humes, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 180 days.

(21) Appl. No.: 11/084,213

(22) Filed: Mar. 17, 2005

(65) Prior Publication Data
US 2006/0209597 A1  Sep. 21, 2006

(51) Int. Cl.
*G11C 11/34* (2006.01)
(52) U.S. Cl. .......................... 365/185.25; 365/185.14; 365/185.28
(58) Field of Classification Search ............ 365/185.25, 365/185.05, 185.08, 185.14, 185.17, 185.29, 365/185.23, 185.28
See application file for complete search history.

(56) References Cited

U.S. PATENT DOCUMENTS

| | | | |
|---|---|---|---|
| 6,865,128 B2 * | 3/2005 | Kanai | 365/203 |
| 2006/0077737 A1 * | 4/2006 | Ooishi | 365/203 |
| 2006/0209598 A1 * | 9/2006 | Wang et al. | 365/185.28 |

* cited by examiner

*Primary Examiner*—Richard T. Elms
*Assistant Examiner*—Hien N Nguyen
(74) *Attorney, Agent, or Firm*—Carl K. Turk; Merchant & Gould (57) ABSTRACT

NVM arrays include rows and columns of NVM cells comprising a floating gate, a programming element, and a logic storage element. During a programming or erase mode, the floating gate of each cell is charged to a predetermined level. At the beginning of a read mode, all storage elements are pre-charged to a high supply voltage level. Following the pre-charge, selected cells are read to determine stored bit values. A charge status of the floating gate of each cell determines whether the storage element is turned on and the pre-charge voltage is pulled down corresponding to a bit value.

17 Claims, 7 Drawing Sheets

COMPACT NON-VOLATILE MEMORY CELL AND ARRAY SYSTEM

RELATED APPLICATIONS

This application is related to U.S. Utility application Ser. No. 10/813,907 (IMPJ-0027A) filed on Mar. 30, 2004, Ser. No. 10/814,866 (IMPJ-0027B) filed on Mar. 30, 2004, and Ser. No. 10/814,868 (IMPJ-0027C) filed on Mar. 30, 2004. All three Applications are incorporated herein by reference.

FIELD OF THE INVENTION

The present invention relates to non-volatile memory cell and array structures, and more particularly, to methods and apparatus for programming, reading or erasing such structures.

BACKGROUND OF THE INVENTION

Memory circuits may be classified in two main categories: volatile and nonvolatile. Volatile memory loses any data as soon as the system is turned off. Thus, it requires constant power to remain viable. Most types of random access memory (RAM) fall into this category. Non-volatile memory does not lose its data when the system or device is turned off. A non-volatile memory (NVM) device may be implemented as a MOS transistor that has a source, a drain, an access or a control gate, and a floating gate. It is structurally different from a standard MOSFET in its floating gate, which is electrically isolated, or "floating".

Non-volatile memory arrays include a plurality of NVM cells arranged in rows and columns. In general, single-transistor n-channel NVM cells operate as follows. During an erase operation, electrons are removed from a floating gate of the NVM cell, thereby lowering the threshold voltage of the NVM cell. During a program operation, electrons are inserted into the floating gate of the NVM cell, thereby raising the threshold voltage of the NVM cell. Thus, during program and erase operations, the threshold voltages of selected NVM cells are changed. During a read operation, read voltages are applied to selected NVM cells. In response, read currents may flow through the selected NVM cells. The magnitudes of the read currents are dependent upon the threshold voltages of the selected NVM cells. In another configuration, output voltages of the NVM cells may be varied between two values based on the threshold voltages of those cells.

SUMMARY

The disclosure facilitates storage of digital information in a non-volatile memory circuit. Accordingly, the disclosure provides programming, erasing, and reading of non-volatile memory arrays.

In some embodiments, storage elements of NVM cells forming an NVM array are pre-charged with high supply voltage at the beginning of a read mode. Depending on a charge level of a floating gate of each cell by a programming element the storage elements of selected cells are turned on causing an output voltage of the selected cells to drop from the high supply voltage level. Accordingly, a digital bit value is stored and read by modifying the floating gate charge level and pre-charging all NVM cells in the NVM array.

Word selection through turning on and off cells of selected rows is achieved by turning on and off word line signals for the selected rows that control a selection transistor in one embodiment and modifying a low supply voltage in another embodiment.

While example embodiments are shown using a floating gate, single transistor storage element, the principles disclosed herein may be implemented in other types of NVM cells. Thus, the invention is not limited to the illustrated examples.

BRIEF DESCRIPTION OF THE DRAWINGS

Non-limiting and non-exhaustive embodiments are described with reference to the following drawings.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity. The term "cell" means a unit NVM circuit comprising of a programming and a storage element that are arranged to store one bit. The term "array, refers to a plurality of NVM cells arranged in columns and rows.

Figure 1:
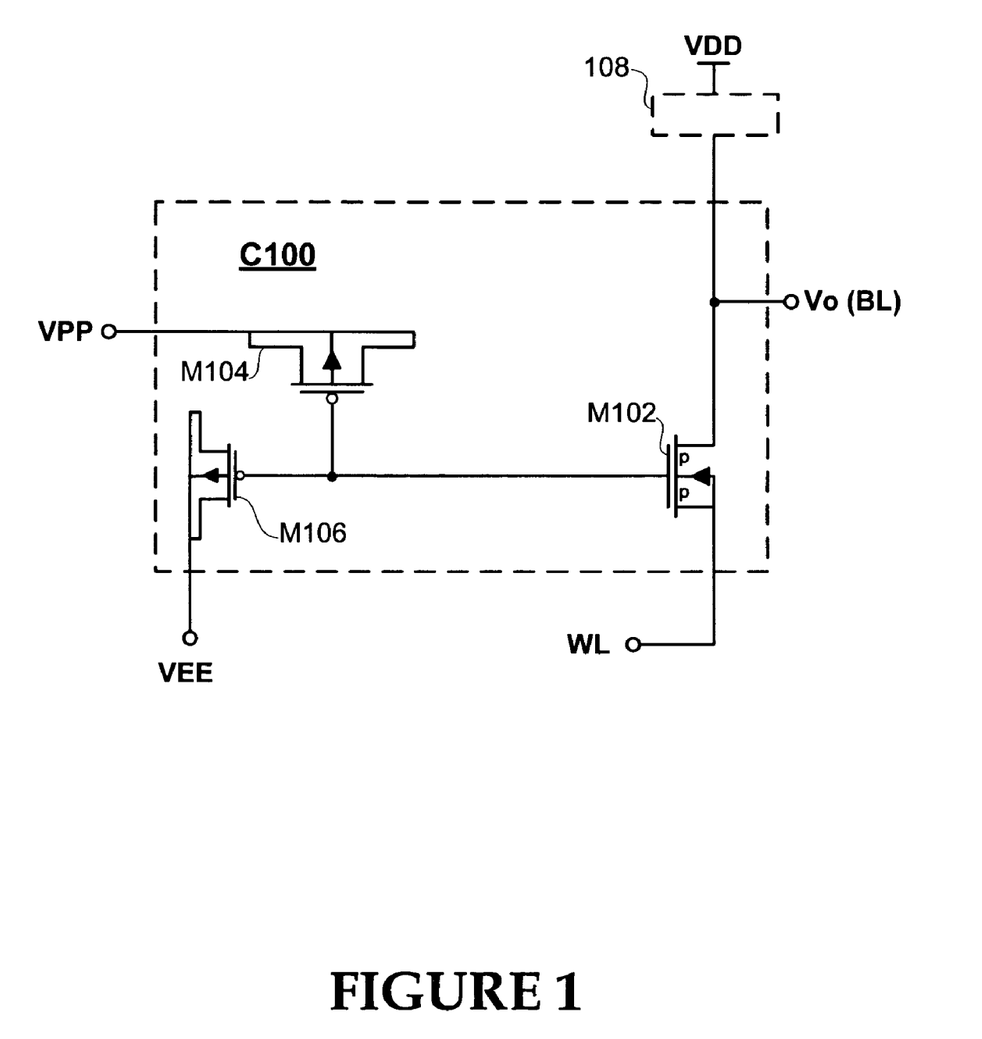
FIG. 1 schematically illustrates one embodiment of a floating gate non-volatile memory (NVM) cell with a gate programming circuit.

FIG. 1 schematically illustrates one embodiment of floating gate NVM cell C100 with a gate programming circuit.

In general, single-transistor n-channel NVM cells operates as follows. During an erase operation, electrons are removed from a floating gate of the NVM cell, thereby lowering a threshold voltage of the NVM cell. During a program operation, electrons are inserted onto the floating gate of the NVM cell, thereby raising the threshold voltage of the NVM cell. Thus, during program and erase operations, the threshold voltages of selected NVM cells are changed. During a read operation, supply voltages are applied to the storage elements of the selected NVM cells. In response, output voltages of these selected NVM cells reflect a bit value based on the stored charges in their floating gates.

Specifically, NVM cell C100 includes first programming transistor M106, second programming transistor M104, and storage transistor M102. Box 108 represents a pre-charge operation at the beginning of the read operation, when storage transistor M102 is pre-charged with high supply voltage VDD.

First programming transistor M106 and second programming transistor M104 together form the programming element of cell C100. First programming transistor M106 and second programming transistor M104 are coupled together at their gate terminals and share floating gate fg with storage transistor M102. A source, a drain, and an n-well terminal of first programming transistor M106 are coupled together to a first programming voltage VEE. A source, a drain, and an n-well terminal of second programming transistor M104 are coupled together to a second programming voltage VPP.

Floating gate type NVM cells may include programming circuits that are arranged to inject electrons onto the floating gate of the storage element employing one of impact-ionized hot-electron injection, Fowler-Nordheim (FN) tunneling, channel hot-electron injection, and band-to-band tunneling induced electron injection.

The programming element is arranged such that electrons are injected onto the shared floating gate fg when first programming voltage VEE has a high value and second programming voltage VPP has a low value. High and low values for the programming voltages may be predetermined based on a type and size of transistors used for M106 and M104. Electrons are removed from the shared floating gate, when first programming voltage VEE has the low value and second programming voltage VPP is set to the high value. First programming transistor M106 is preselected such that its area is larger than the areas of second programming transistor M104 and storage transistor M102. In one embodiment, a size ratio between M106 and M104 may be between about four and about five. However, the invention is not limited to this ratio.

In a programming operation, a high value for programming voltage VEE (e.g. ~10V) is applied to the source, drain, and n-well terminals of M106 (larger size transistor) and about 0V is applied to the source, drain, and n-well terminals of M104 (smaller size transistor). As a result, the shared floating gate fg is coupled at about +9V due to an effect of size difference. This results in about 9V across the smaller transistor from its gate terminal to its source, drain, and n-well terminals, and electrons are attracted to shared floating gate fg. On the other hand, there is only about 1V across M106 transistor, thus no current flow.

In an erase operation, a high value for programming voltage VPP (e.g. ~10V) is applied to the source, drain, and n-well terminals of M104 (smaller size transistor) and about 0V is applied to the source, drain, and n-well terminals of M106. As a result, the floating gate is coupled at about 1V due to the size difference effect. This results in about 9V (10V–1V) across the smaller transistor from its source, drain, and n-well terminals to its gate terminal, and electrons are removed from shared floating gate fg.

For either erase or programming operations, there is about 9V across the smaller transistor (M104) with a different polarity in each case. The polarity of the 9V determines a flowing direction of the electrons resulting in either programming or erase operations.

The storage element of cell C100 is formed by storage transistor M102. A source terminal of storage transistor M102 is coupled to box 108 representing the pre-charge operation. Box 108 is coupled to high supply voltage VDD. A source terminal of M102 is arranged to word line signal WL that is used to select a row within an NVM array. Output voltage Vo, also termed bit line signal BL, is provided at the drain terminal of M102.

According to one embodiment, following the programming and/or erase operations, when the charge level of floating gate fg is adjusted to a predetermined level, a read operation begins with "pre-charging" of the storage element of NVM cell C100. Pre-charging of an NVM array comprising NVM cells like cell C100 includes applying high supply voltage VDD to the source terminals of all storage transistors such as transistor M102 of C100. Following pre-charging, row selection signal WL is applied at a low signal level (e.g. 0). If the charge level of floating gate fg is such that M102 is turned on, M102 allows current flow and output voltage Vo drops from VDD to a low logic output value (e.g. ~0V). On the other hand, if the charge level of the floating gate is such that M102 is not turned on and no current flows. Accordingly, Vo remains at high logic value (e.g. ~VDD).

Applying WL at low level (e.g. ~0V) enables current flow through M102 selecting C100 for reading of the stored bit value. Values of Vo corresponding to "1" and "0" bit values may be determined based on a size and type of M102, a value of high and low supply voltages, and a value of the threshold voltage for the storage transistor. In one embodiment, M104 and M106 may be p-type FETs, and M102 a gate p-doped n-type FET.

Doping of the polysilicon n-type FET with p-type impurities provides for longer retention time enhancing the non-volatility of NVM cell 100. A structure and operation of a p-doped, polysilicon, shared gate transistor pair is discussed in detail in U.S. patent application Ser. No. 11/095,938, filed on even date herewith, entitled "SYSTEMS AND METHODS FOR RETENTION ENHANCED PROGRAMMABLE SHARED FLOATING GATE LOGIC CIRCUIT."

Figure 2:
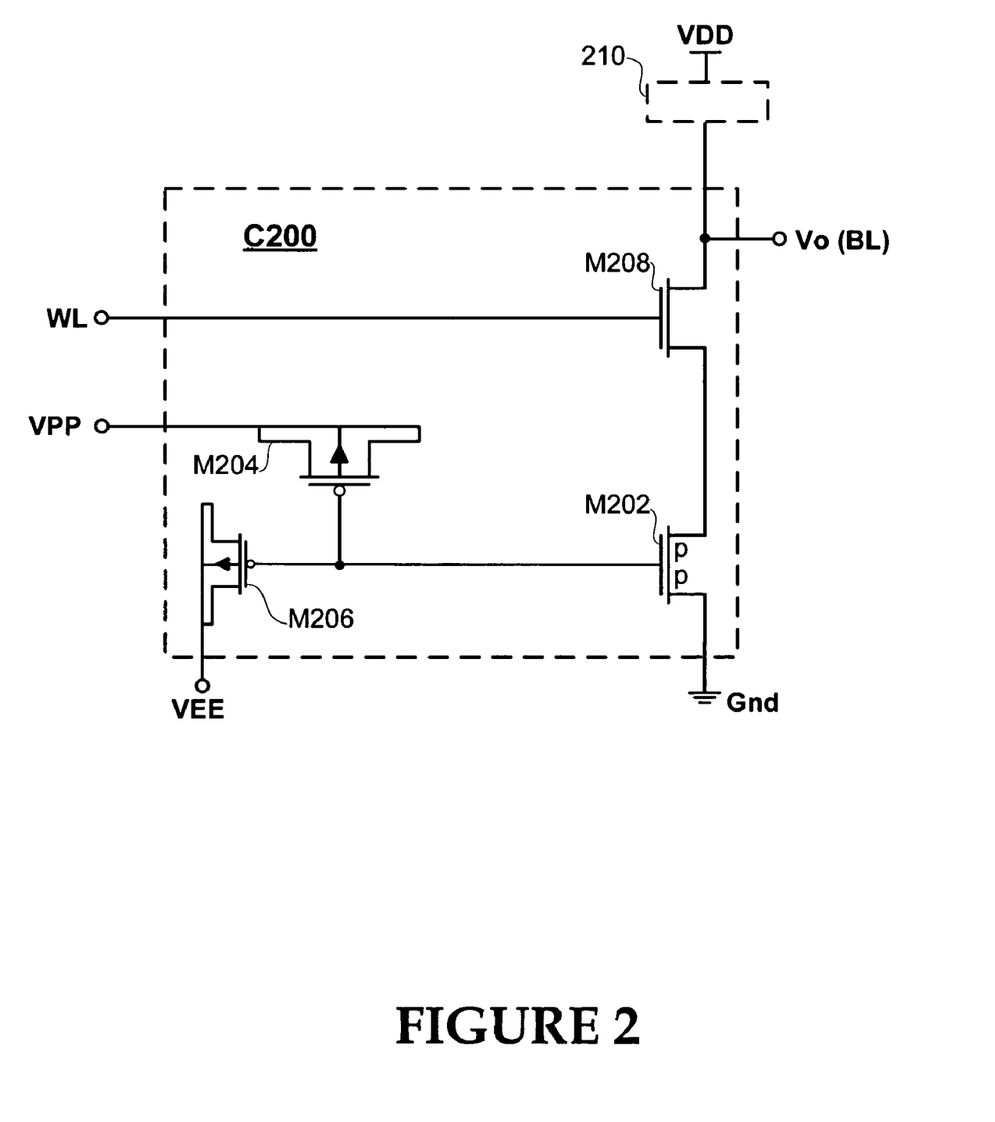
FIG. 2 schematically illustrates another embodiment of the floating gate non-volatile memory (NVM) cell with gate programming circuit.

FIG. 2 schematically illustrates another embodiment of floating gate NVM cell C200 with gate programming circuit.

Components of NVM cell C200 arranged to operate in a likewise manner to similarly numbered components in NVM cell 100 of FIG. 1. For example programming transistors M204 and M206 are arranged to operate as explained previously injecting or removing electrons to and from floating gate fg in response to VPP and VEE.

The storage element of cell 200 includes selection transistor M208 and pull-down transistor M202. Unlike NVM cell C100 of FIG. 1, storage transistor M202 is coupled to a ground signal at its source terminal in NVM cell C200. Selection transistor M208 is arranged to receive VDD at is drain terminal. Box 210, similar to box 108 of FIG. 1, represents a pre-charging operation at the beginning of a read operation, when all cells are applied VDD. Output voltage Vo (also bit line BL) is determined at the drain terminal of M208. Source terminal of M208 and drain terminal of M202 are coupled together. In one embodiment, M202 may be a polysilicon n-type FET doped with p-type impurities for better retention as describe above.

Figure 3:
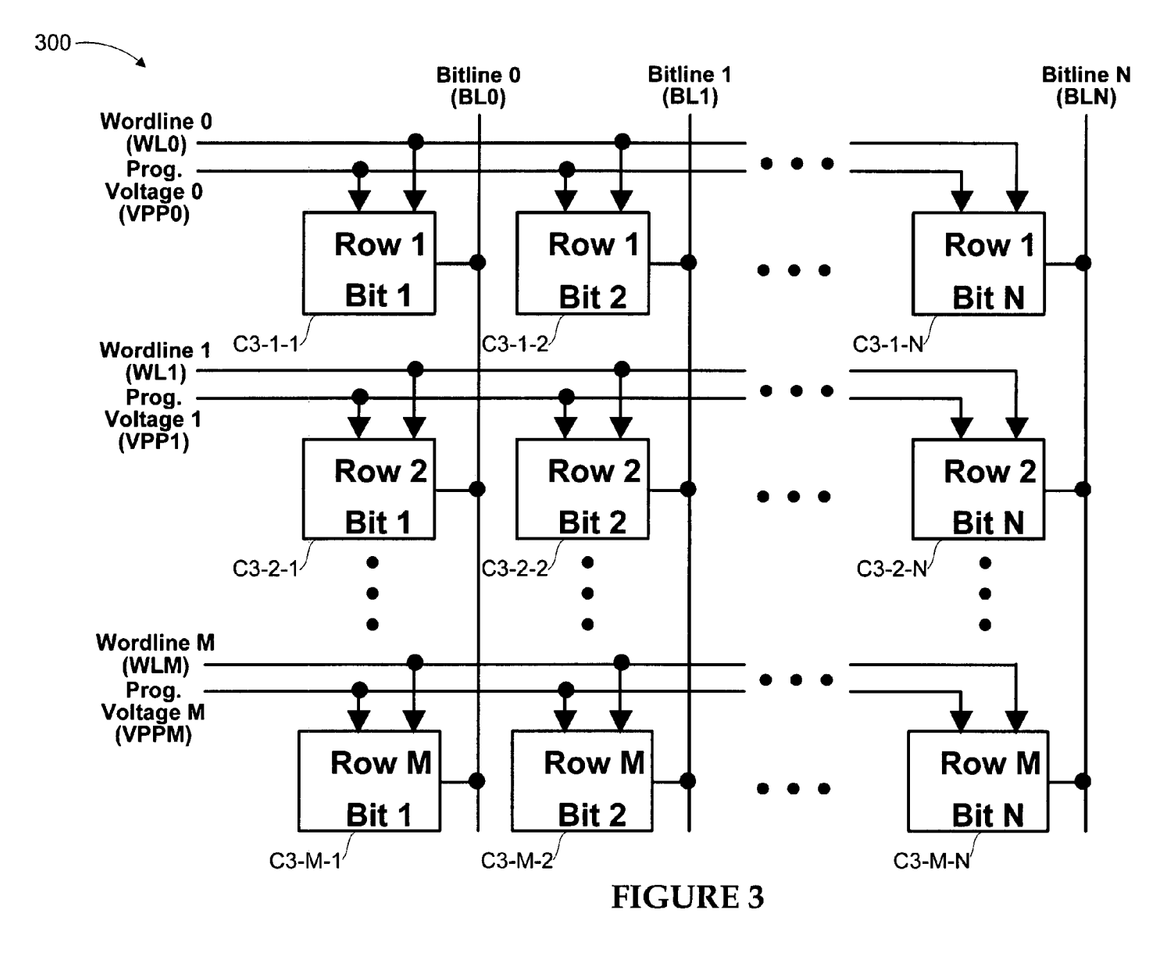
FIG. 3 is a block diagram of an NVM array that includes the NVM cells of FIG. 1 or FIG. 2 according to one embodiment.

FIG. 3 is a block diagram of NVM array 300 that includes the NVM cells of FIG. 1 or FIG. 2 according to one embodiment.

As mentioned previously, NVM arrays include a plurality of NVM cells arranged in rows and columns. In NVM array 300, cells C3-1-1 through C3-1-N are arranged in a row storing bits 1 through N, respectively. Similarly, cells C3-2-1 through C3-2-N form the second row storing a second word and cells C3-M-1 through C3-M-N form Mth row storing an Mth word. M and N are integers indicating a maximum row and column number, respectively.

Programming voltages for each row are represented by VPP0 through VPPM. In one embodiment, as described in conjunction with FIGS. 1 and 2, the programming elements may receive two different programming voltages, VEE and VPP. The programming voltages are shown as one voltage in FIG. 3 for simplicity.

Each row of NVM cells may be selected for read mode operations by word line voltages WL0 through WLM. Word line voltages may be implemented as a portion of supply voltage VDD (e.g. ~

$$\frac{1}{2}$$

VDD or 0V) and employed to turn on the storage elements of each NVM cell within a row.

In a read mode, output voltages of individual NVM cells may be read at the bit lines BL0 through BLN, which are coupled to output nodes of each NVM cell within a corresponding column.

In a read operation, rows of NVM cells may be selected by providing a predetermined value of word line voltage (e.g. 0V) to the selected rows. Then, selected NVM cells within each column may be read by selecting a corresponding bit line. For example, if NVM cell C3-2-2 is to be read, first WL1 may be set to the predetermined turn-on value, while other WL's are remain at the predetermined turn-off value. Then, BL1 may be recorded providing the stored bit value in NVM cell C3-2-2. to read the whole NVM array, word line voltages WL0 through WLM may be set to turn-on value one-by-one as other WL's are set to turn-off value, and during each step BL1 through BLN may be read, thereby providing the stored word values for each row individually.

Figure 4:
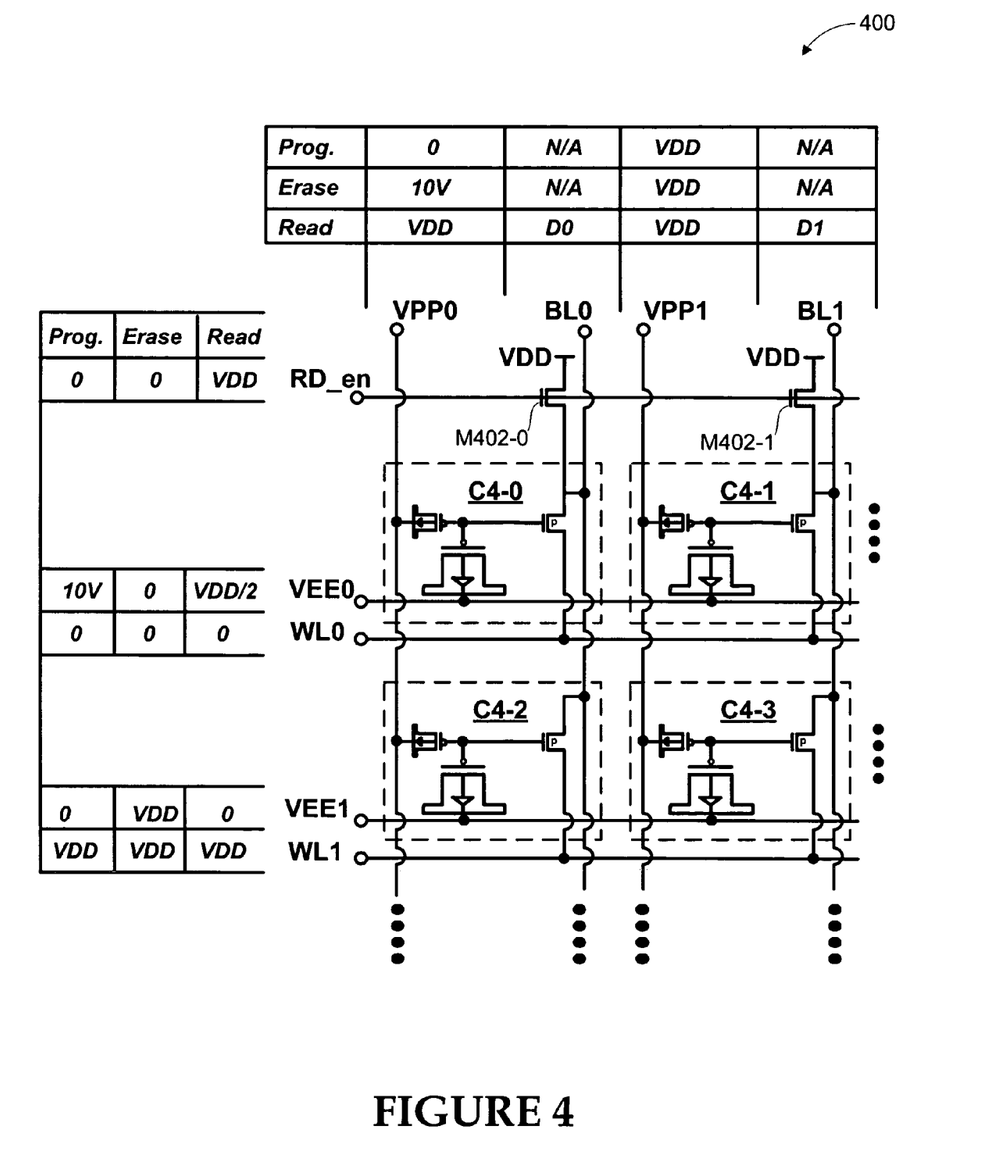
FIG. 4 is a schematic block diagram of one embodiment of an NVM array employing the NVM cell of FIG. 1 with n-FET pre-charge transistors along with example values for various voltages for individually selectable bit operation of programming, erase, and read modes.

FIG. 4 is a schematic block diagram of one embodiment of NVM array 400 employing the NVM cell of FIG. 1 with n-FET pre-charge transistors along with example values for various voltages for individually selectable bit operation of programming, erase, and read modes.

NVM array 400 includes four example NVM cells C4-0, C4-1, C4-2, and C4-3. As shown in the figure, individual cells include programming and storage elements similar to those illustrated in FIG. 1. Additionally, each column of NVM array 400 includes a pre-charge transistor M402-X, where X denotes a column designator. Pre-charge transistor M402-X is arranged to be coupled between high supply voltage VDD and a drain terminal of a storage transistor of each cell within the same column. Pre-charge transistor M402-X is further arranged to receive a read-enable voltage RD_en at a gate terminal.

In an example read operation, when cell C4-0 is to be read, all cells are pre-charged by applying VDD first. This is accomplished by turning on pre-charge transistors M402-X with read enable signal RD_en and applying VDD to WL's. Following pre-charging, row selection signals WL are applied. In this example WL0 is set to 0V, while WL1 is set to VDD. Accordingly, even if storage elements of cells C4-1 and C4-2 are turned on after pre-charging, there is no current flow and no output voltage change for the second row. On the other hand, for the selected first row the output voltage read for each column as BLX (X denoting column number) is determined by a state of the storage element of each cell being turned on or off. For example, if the floating gate of C4-0 is charged sufficiently such that the storage transistor of C4-0 is turned on, BL0 for that cell drops from VDD because current flows through the storage transistor.

Furthermore, setting WL1 to VDD prevents further current flow through the storage transistor of C4-1, which sets the bit value of only C4-0 at a bit value (e.g. "0"). A reading circuit may read bit lines consecutively or simultaneously determining stored bit values of selected cells within the NVM array.

FIG. 4 further includes tables showing example values for word line, bit line, and programming voltages in different operation modes. For example, in an erase operation, programming voltages for cell C4-0 may be selected as VEE0=0V and VPP0=10V. This results in removal of electrons from the shared gate of storage transistors of cell C4-0 as explained in FIG. 1 storing a low bit value in the cell.

In a programming mode, programming voltages for cell C4-0 may be selected as VEE0=10V and VPP0=0V. This results in injection of electrons onto the shared gate of storage transistors of cell C4-0 as explained in FIG. 1 storing a high bit value in the cell. Note that in both the erase and the programming modes, word line voltage WL0 and read enable voltage RD_en are set to 0V turning off the storage transistor of C4-0.

While NVM array 400 is illustrated with four example cells and particular values for programming and word line selection voltages, the invention is not so limited. Other arrangements of arrays with fewer or more cells and other values of voltages may be selected without departing from the scope and spirit of the invention.

Figure 5:
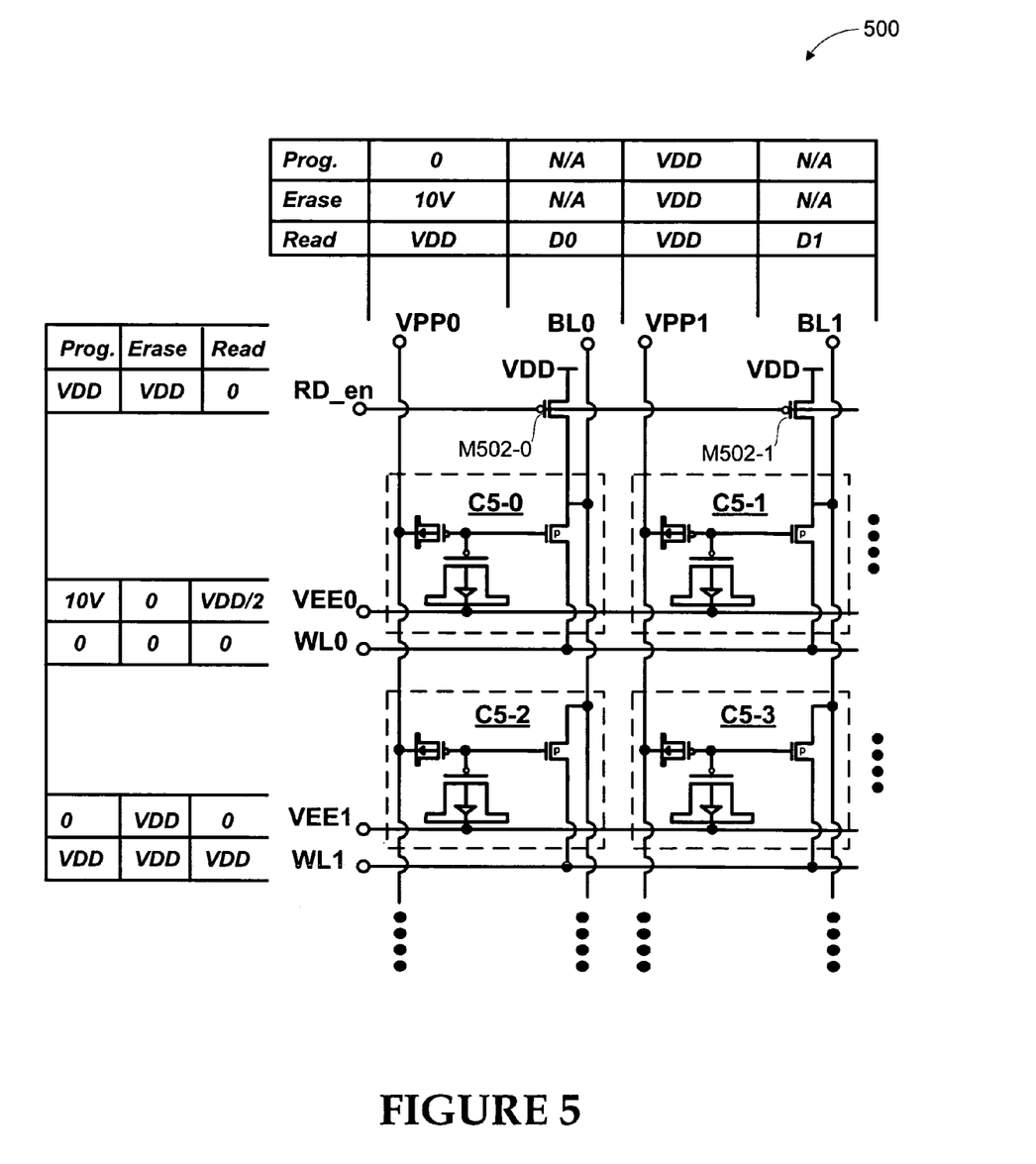
FIG. 5 is a schematic block diagram of another embodiment of the NVM array of FIG. 4 with p-FET pre-charge transistors along with example values for various voltages for individually selectable bit operation of programming, erase, and read modes.

FIG. 5 is a schematic block diagram of another embodiment of NVM array 500 of FIG. 4 with p-FET pre-charge transistors along with example values for various voltages for individually selectable bit operation of programming, erase, and read modes.

Components of NVM array 500 that are similarly numbered in NVM array 400 of FIG. 4 are arranged to operate in a likewise manner as in NVM array 400. One difference between the embodiments of FIG. 4 and FIG. 5 is the use of p-FET type pre-charge transistors M502-X instead of n-FET type pre-charge transistors.

Storage transistors of cells C4-0 through C4-2 may be implemented as p-doped polysilicon n-type FETs for improved retention. Similar to NVM array 400, all storage transistors may be pre-charged at the beginning of a read operation. An output voltage of selected cells is read as bit line voltage BLX, where X denotes a column number. A value of the output voltage for those cells, where the storage transistor is turned on drops, while another value for other cells, where the storage transistor is not turned on, remains at about the high supply voltage level. Turning on and off of the storage transistors is controlled by a charge level of the floating gate.

Programming transistors enable injection or removal of electrons to and from the floating gate in an erase operation or in a programming operation.

Figure 6:
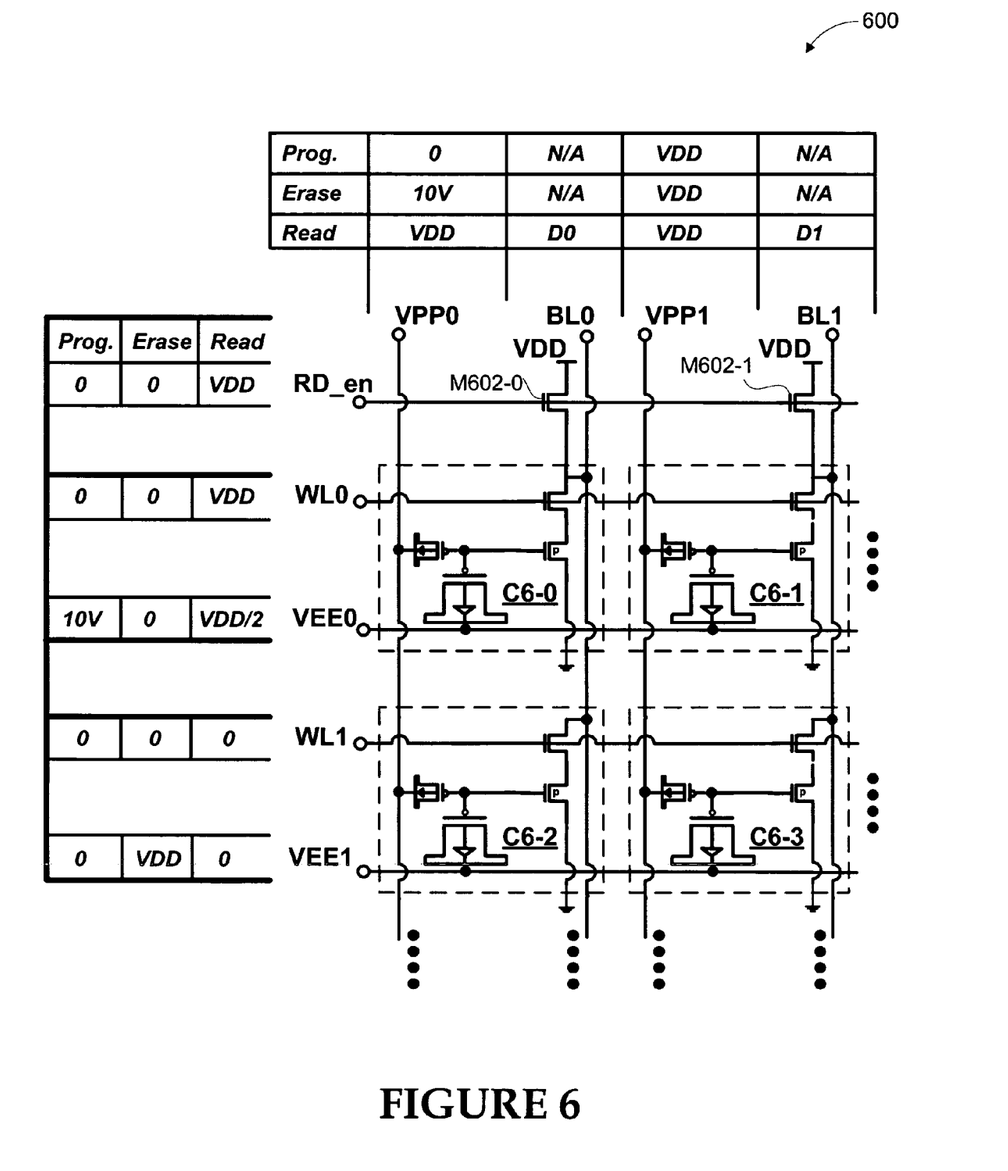
FIG. 6 is a schematic block diagram of one embodiment of an NVM array employing the NVM cell of FIG. 2 with n-FET pre-charge transistors along with example values for various voltages for individually selectable bit operation of programming, erase, and read modes.

FIG. 6 is a schematic block diagram of one embodiment of NVM array 600 employing the NVM cell of FIG. 2 with n-FET pre-charge transistors along with example values for various voltages for individually selectable bit operation of programming, erase, and read modes.

Components of NVM array 600 that are similarly numbered in NVM array 400 of FIG. 4 are arranged to operate in a likewise manner as in NVM array 400. The NVM cells of NVM array 600 include an additional selection transistor. Each cell operates as described in conjunction with FIG. 2. Row selection signal WLY (Y denotes row number) for a selected row turns on the selection transistor, which provides high supply voltage VDD to the pull-down transistor at pre-charge mode. If the pull-down transistor is turned on due to programmed charge level at its floating gate, current flows through the storage element of the cells within the selected row causing an output voltage to drop. Accordingly, a bit line signal (BL) reads the stored bit value based on the output voltage.

Similar to NVM array 400 of FIG. 4, setting WL1 to 0 prevents further current flow through the storage element of the unselected row by turning off the selection transistors of that row.

FIG. 6 also includes tables showing example values for word line, bit line, and programming voltages in different operation modes. An example of programming voltage values in an erase and programming operation and reading of the stored bit value for cell C4-0 are represented in the corresponding table elements.

Figure 7:
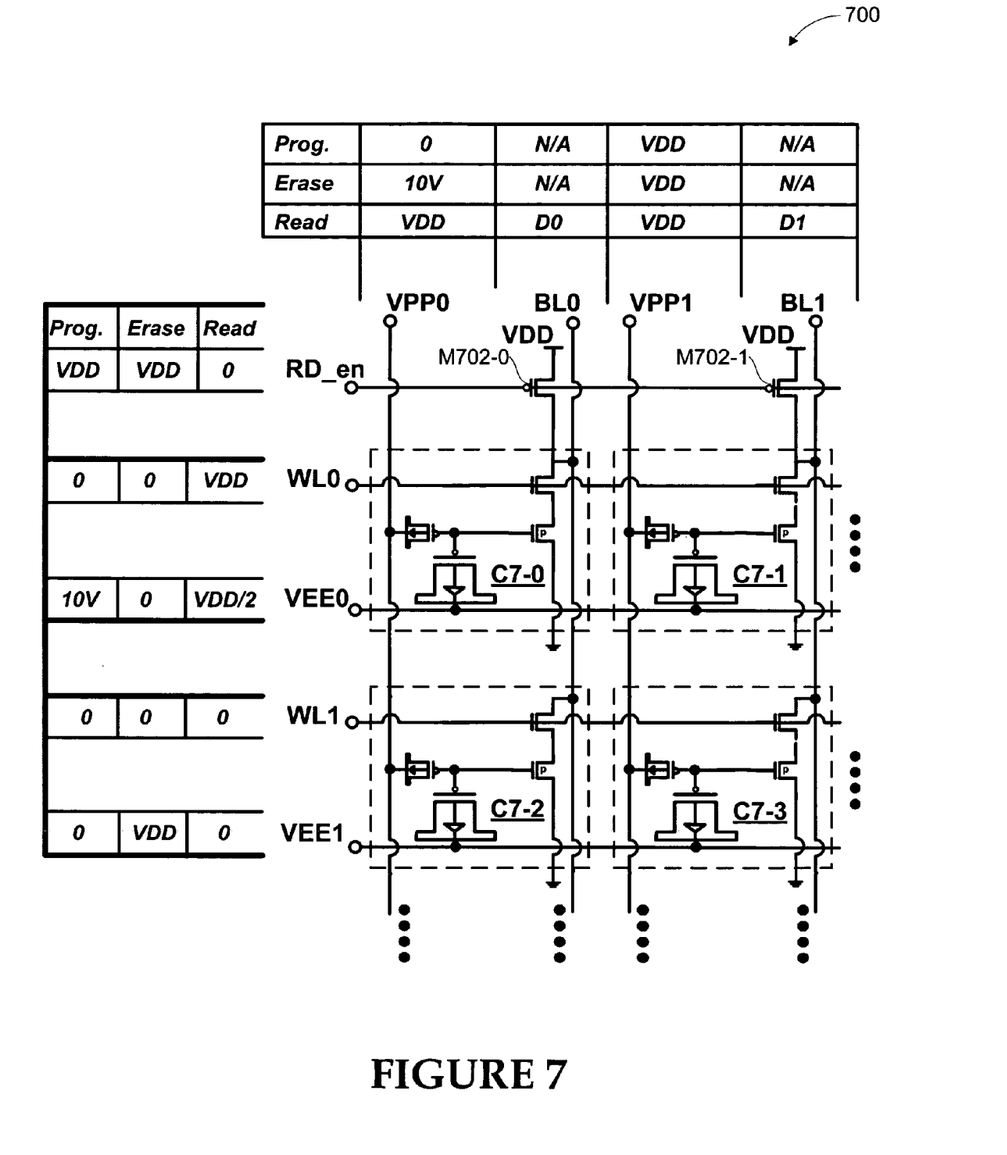
FIG. 7 is a schematic block diagram of another embodiment of the NVM array of FIG. 6 with p-FET pre-charge transistors along with example values for various voltages for individually selectable bit operation of programming, erase, and read modes.

FIG. 7 is a schematic block diagram of another embodiment of NVM array 700 of FIG. 6 with p-FET pre-charge transistors along with example values for various voltages for individually selectable bit operation of programming, erase, and read modes.

Components of NVM array 700 that are similarly numbered in NVM array 600 of FIG. 6 are arranged to operate in a likewise manner as in NVM array 600. One difference between the embodiments of FIG. 6 and FIG. 7 is the use of p-FET type pre-charge transistors M702-X instead of n-FET type pre-charge transistors.

Example values for programming and read enable signals in the accompanying tables reflect the use of different type transistor. Other aspects of programming, erase, and read mode operations are similar to those of NVM array 600 of FIG. 6.

In NVM arrays 600 and 700, a pre-charge bias in combination with a word line bias eliminates current flow through the storage element during the erase and the programming operations. As described previously, the bit line is pre-charged to a about VDD level at the beginning of a read operation. In cells, where the floating gate is programmed to turn on the storage transistor, the pull-down transistor pulls down the bit line.

This embodiment, along with other example embodiments described herein, enables implementation of low transistor count NVM arrays with individually addressable bits.

The examples provided above are for illustration purposes and do not constitute a limitation on the present invention. Other embodiments may be implemented using other arrangements of NVM cells within an NVM array and other implementations of NVM cells without departing from the scope and spirit of the invention. For example, other logic circuit types such as NOR and NAND gates may be implemented as storage elements within the NVM cells of the NVM arrays.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A non-volatile memory (NVM) system, comprising:
   an array of NVM cells configured in rows and columns, each NVM cell comprising a storage element and a programming element such that each NVM cell is arranged to be programmed, erased, and read based on a plurality of row selection, column selection, and programming signals, wherein a supply voltage for the programming elements is turned off during a programming mode and an erase mode; and
   a pre-charge circuit for each column of cells that is configured to provide a pre-charge voltage to all cells within each column prior to a read mode.

2. The system of claim 1, wherein
   the storage element is further arranged to serve as a built-in read-out element.

3. The system of claim 1, wherein
   the storage element of each NVM cell comprises a field effect transistor (FET) of a first type that is doped with impurities of a second type; a floating gate terminal of the PET is arranged to receive charges based on the programming signal; and wherein a source terminal of the FET is arranged to receive the row selection signal.

4. The system of claim 1, wherein
   the storage element of each NVM cell comprises:
   a first FET of the first type that is doped with impurities of the second type, wherein a floating gate terminal of the first FET is arranged to receive charges based on the programming signal, and a source terminal of the first FET is arranged to receive a low supply voltage; and
   a second FET of the first type, wherein a source terminal of the second FET is coupled to a drain terminal of the first FET, a gate terminal of the second FET is arranged to receive the row selection signal, and a drain terminal of the second FET is arranged to receive a high supply voltage.

5. The system of claim 4, wherein
   the first type is p-type and the second type is n-type.

6. The system of claim 1, wherein
   the pre-charge circuit for a column comprises at least one of a p-FET and an n-FET such that an output node of each NVM cell within the column is provided with a high supply voltage based on a read-enable signal.

7. The system of claim 6, wherein
   a stored bit value of a cell is determined by an output voltage of the cell at the output node such that:
   the output voltage is substantially equal to the high supply voltage, if a floating gate of the storage element has a predetermined charge level; and the output voltage is substantially equal to a low supply voltage, if a floating gate of the storage element has another predetermined charge level.

8. The system of claim 1, wherein the programming element of each NVM cell is arranged to inject electrons to a floating gate of the storage element and remove electrons from the floating gate based on the programming signal.

9. The system of claim 8, wherein the programming element is arranged to inject electrons to the common floating gate by at least one of: impact-ionized hot-electron injection, Fowler-Nordheim (FN) tunneling, channel hot-electron tunneling, and band-to-band tunneling induced electron injection.

10. The system of claim 8, wherein the programming element is arranged to remove electrons from the common floating gate by FN tunneling.

11. The system of claim 8, wherein the programming element comprises two p-FETs coupled together at their gate terminals such that electrons are injected to the common floating gate when a high programming voltage is provided to a source, a drain, and an n-well terminal of a first p-FET of the two p-FETs and a low programming voltage is provided to a source, a drain, and an n-well terminal of a second p-FET of the two p-FETs, wherein the gate terminals of the first and second p-FETs are coupled to the common floating gate of the storage element.

12. The system of claim 11, wherein the programming element is arranged to remove electrons from the common floating gate when a low programming voltage is provided to the source, the drain, and the n-well terminal of the first p-FET of the two p-FETs and a high programming voltage is provided to the source, the drain, and the n-well terminal of the second p-FET of the two p-FETs.

13. The system of claim 1, wherein each NVM cell is individually selectable to be programmed, erased, and read based on the row selection, column selection, and programming signals.

14. The system of claim 1, wherein the storage element of each NVM cell includes a four-FET logic circuit in NAND) configuration capable of storing two bits.

15. The system of claim 1, wherein the storage element of each NVM cell includes a four-FET logic circuit in NOR configuration capable of storing two bits.

16. The system of claim 1, wherein adjacent columns of the array of NVM cells share a common bit line.

17. A non-volatile memory (NVM) system, comprising:
a means for turning off storage means of all NVM cells based on row selection signals upon detecting an initiation of a programming cycle;
a means for adjusting a charge storage level of floating gates of the storage means of selected NVM cells to reflect bit values assigned to the selected NVM cells based on programming signals;
a means for turning off the storage means of all NVM cells based on row selection signals upon detecting an initiation of an erase cycle;
a means for removing electrons from the floating gates of the storage means of the selected NVM cells to reflect zero bit values assigned to the selected NVM cells based on the programming signals;
a means for turning on the selected NVM cells based on row selection signals upon detecting an initiation of a read cycle;
a means for pre-charging all NVM cells such that output voltages of all NVM cells are substantially equal to a high supply voltage; and
a means for reading stored bit values of the selected NVM cells based on a column selection and a row selection, wherein each stored bit value is determined based on the output voltage of the selected NVM cell, and wherein the output voltage of the selected NVM cells are substantially equal to one of the high supply voltage and a low supply voltage depending on a charge level of the floating gate of the selected NVM cell.

* * * * *

UNITED STATES PATENT AND TRADEMARK OFFICE
CERTIFICATE OF CORRECTION

PATENT NO. : 7,263,001 B2  Page 1 of 1
APPLICATION NO. : 11/084213
DATED : August 28, 2007
INVENTOR(S) : Wang et al.

It is certified that error appears in the above-identified patent and that said Letters Patent is hereby corrected as shown below:

In column 5, line 36 - 42, delete " ½ VDD or 0V) and employed…………..Within a row." and insert the same on Line 34 (Approx.) after "(e.g. ~" as continuation of the same paragraph.

In column 5, line 55, delete "C3-2-2." and insert -- C3-2-2 --, therefor.

In column 8, line 21, Claim 1, delete "element" and insert -- element, --, therefor.

In column 8, line 37, Claim 3, delete "PET" and insert -- FET --, therefor.

In column 10, line 3, Claim 14, delete "NAND)" and insert -- NAND --, therefor.

Signed and Sealed this

Twenty-second Day of July, 2008

JON W. DUDAS
*Director of the United States Patent and Trademark Office*